United States Patent [19]

Kalisher

[11] Patent Number: 5,512,511
[45] Date of Patent: Apr. 30, 1996

[54] PROCESS FOR GROWING HGCDTE BASE AND CONTACT LAYER IN ONE OPERATION

[75] Inventor: Murray H. Kalisher, Goleta, Calif.

[73] Assignee: Santa Barbara Research Center, Goleta, Calif.

[21] Appl. No.: 248,135

[22] Filed: May 24, 1994

[51] Int. Cl.$^6$ .................................................. H01L 21/20
[52] U.S. Cl. ............................ 437/130; 437/5; 117/957
[58] Field of Search ...................... 437/5, 130; 117/957

[56] References Cited

U.S. PATENT DOCUMENTS

| | | | |
|---|---|---|---|
| 3,218,203 | 11/1965 | Ruehrwein | 117/957 |
| 4,906,325 | 3/1990 | Bernardi | 117/957 |
| 5,192,695 | 3/1993 | Wang et al. | 437/5 |
| 5,241,196 | 8/1993 | Huang et al. | 257/185 |
| 5,296,384 | 3/1994 | Cockrum et al. | 437/5 |
| 5,391,882 | 2/1995 | Rhiger | 250/370.13 |

OTHER PUBLICATIONS

"Growth of $Hg_{1-x}Cd_x Te$ Heterolayers by Slider LPE Using Seperate Compensating Atmosphere of Mercury", Journal of Crystal Growth 113, pp. 520–526 (1991) by J. S. Chen et al.

T. Tung et al., "Liquid–Phase Epitaxy of $Hg_{1-x}Cd_x Te$ from Hg Solution: A Route to Infrared Detector Structures", Materials for Infrared Detectors and Sources, Mater. Res. Socl. Symp. Proc. vol. 90 (Mater. Res. Soc., Pittsburgh, PA, 1987), p. 321.

T. Tung, "Infinite–Melt Vertical Liquid–Phase Epitaxy of HgCdTe from Hg Solution: Status and Prospects", J. Crystal Growth 86 (1988), pp. 161–172.

*Primary Examiner*—Nam Nguyen
*Assistant Examiner*—Linda J. Fleck
*Attorney, Agent, or Firm*—W. C. Schubert; W. K. Denson-Low

[57] ABSTRACT

A method for fabricating a two layer epitaxial structure by a liquid phase epitaxy (LPE) process, the structure being comprised of a Group II–VI semiconductor material. The method includes the steps of providing an LPE growth chamber that contains a molten Group II–VI semiconductor material 24, the molten Group II–VI semiconductor material having a first temperature ($T_1$); growing, at the first temperature, a base layer (22) from the molten Group II–VI semiconductor material, the base layer being grown to have a first bandgap energy; employing a shutter mechanism (30) to isolate the base layer from the molten Group II–VI semiconductor material without removing the base layer from the growth chamber; reducing the first temperature of the molten Group II–VI semiconductor material to a second temperature ($T_2$); and growing from the same molten Group II–VI semiconductor material a contact layer (32) upon a surface (22a) of the base layer, the contact layer being grown to have a second bandgap energy that is narrower than the first bandgap energy. The base layer is not removed from the growth chamber until after the growth of the contact layer, and is thus not required to be exposed to the atmosphere or to any other sources of contaminates.

16 Claims, 3 Drawing Sheets

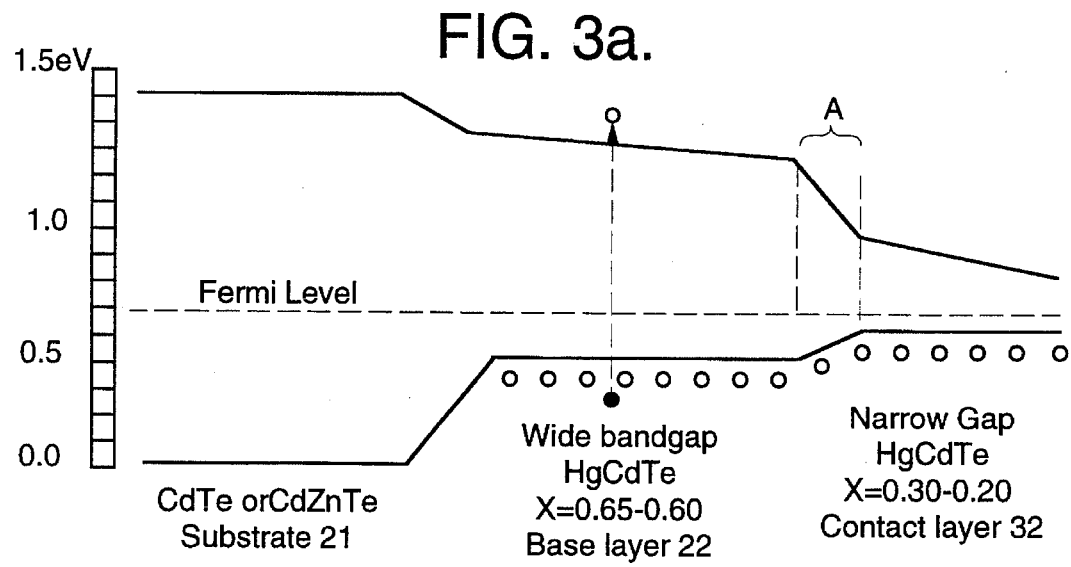
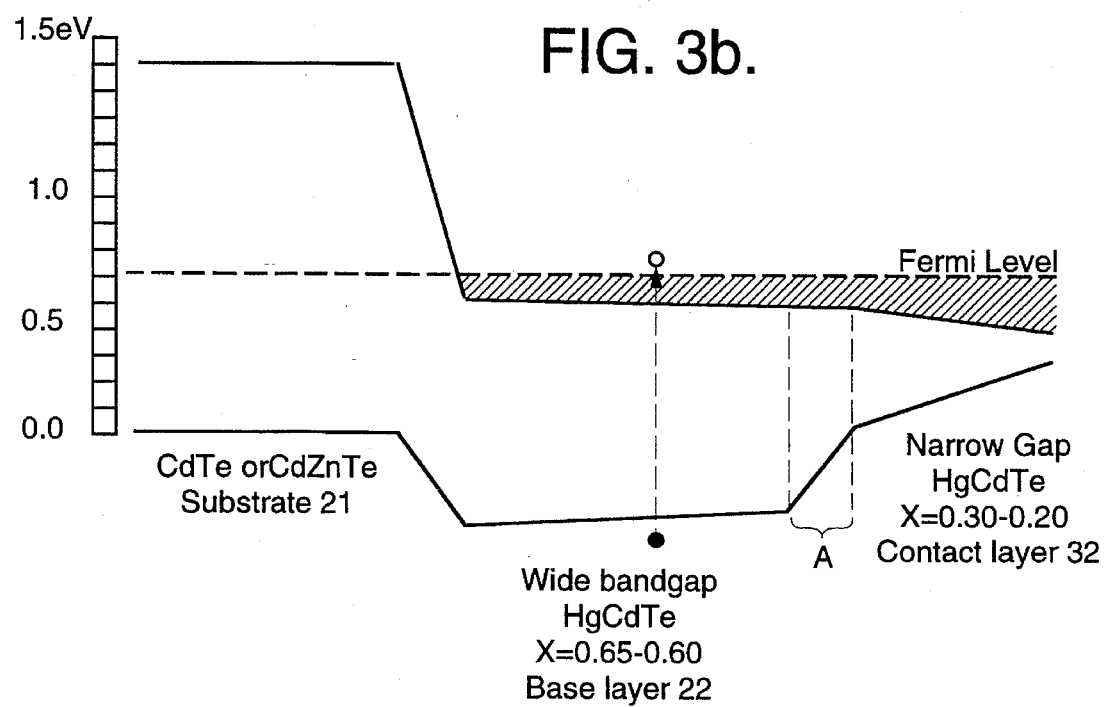

5,512,511

PROCESS FOR GROWING HGCDTE BASE AND CONTACT LAYER IN ONE OPERATION

STATEMENT OF GOVERNMENT INTEREST

This invention was made with Government support under contract MDA904-92-C-6049 awarded by the Department of Defense. The Government has certain rights in the invention.

FIELD OF THE INVENTION

This invention relates generally to methods for fabricating semiconductor devices and, in particular, to methods for fabricating semiconductor devices, such as photodetectors and the like, by a liquid phase epitaxy (LPE) process.

BACKGROUND OF THE INVENTION:

One problem that arises when it is required to form an electrical (ohmic) contact to a base layer comprised of wide-bandgap semiconductor material, such as the Group II–VI alloy $Hg_{1-x}Cd_xTe$, is in forming a high conductivity contact. For values of x that are greater than approximately 0.4 it becomes difficult to match the work function of the base layer to the work function of the contact metal system. One undesirable result of a mismatch in work functions may be the formation of a non-ohmic (rectifying) electrical contact to the base layer.

Some conventional contact systems include one or more layers of metalization that are deposited directly upon the wide-bandgap base layer. In that the surface of the base layer will typically be exposed to atmospheric and other contaminants during the metalization process, and also possibly during a subsequent high-temperature anneal, there exists a potential to generate surface oxides, defects and barriers at the base layer/metal interface. These defects and barriers adversely impact the quality of the base layer and the electrical contact by inhibiting the transfer of charge carriers across the interface.

A further problem is created in that the presence of these impurities also adversely impact the matching of the work function of the contact metal to the work function of the underlying semiconductor material of the base layer. As was indicated above, a mismatch in work functions may result in the undesirable formation of a non-ohmic (rectifying) electrical contact to the base layer.

An alternate approach to forming the contact would form a cap or contact layer upon the base layer, and then deposit the contact metalization upon the contact layer.

For the case where the base layer is fabricated by LPE, conventional practice (for a large melt volume, Hg-rich LPE process) removes the base layer from the LPE growth chamber and then further processes the base layer to form the contact layer by, for example, vapor phase epitaxy (VPE), chemical vapor deposition (CVD), or metal-organic chemical vapor deposition (MOCVD). However, removing the base layer from the growth chamber exposes the layer to atmospheric contaminants which may adversely affect the quality of the resulting electrical contact. Furthermore, the additional processing steps tend to increase the cost and reduce the yield of the semiconductor component that includes the base layer.

An alternate LPE process to the Hg-rich, single melt process described above employs a plurality of Te-rich growth solutions to fabricate double layers of HgCdTe. As an example of this technique, reference may be had to an article entitled "Growth of $Hg_{1-x}Cd_xTe$ heterolayers by slider LPE using separate compensating atmosphere of mercury", Journal of Crystal Growth 113, pgs. 520–526 (1991) by J. S Chen et al. As described in this article, two Te-rich HgCdTe solutions are required within the growth chamber. The solution that is used to grow the second layer is doped with indium to provide an n-p Junction between the two layers.

OBJECTS OF THE INVENTION

It is an object of this invention to provide an Hg-rich, large melt volume LPE fabrication process that overcomes the foregoing and other problems, and that enables a contact layer to be grown upon a base layer from a single melt solution.

It is another object of this invention to provide a fabrication process that forms a narrower bandgap contact layer upon a wider bandgap base layer through the use of an LPE process that employs a single melt solution, and that furthermore avoids exposing the surface of the base layer to any significant amounts of atmospheric and other contaminants.

It is a further object of this invention to provide a fabrication process that forms a Group II–VI contact layer upon a Group II–VI base layer entirely through the use of an LPE process, wherein the temperature of the LPE melt solution is varied to achieve the growth of the contact layer to have a narrower bandgap than the bandgap of the base layer, and wherein the base layer and contact layer are grown from the same melt and contain the same semiconductor material and dopant species.

It is a further object of this invention to provide a multilayered structure that is formed in accordance with the fabrication process of this invention.

SUMMARY OF THE INVENTION

The foregoing and other problems are overcome and the objects of the invention are realized by a method for fabricating an epitaxial structure comprised of a semiconductor material, and by an epitaxial structure fabricated in accordance with the process.

The method includes a first step of providing a growth chamber that contains a molten semiconductor material, the molten semiconductor material having a first temperature. Subsequent steps of the method include growing, at the first temperature, a first or base layer of the structure from the molten semiconductor material, the first layer being grown to have a first bandgap energy; reducing the first temperature of the molten semiconductor material to a second temperature without removing the first layer from the growth chamber; and growing from the same molten semiconductor material a second or contact layer upon a surface of the first layer, the second layer being grown to have a second bandgap energy that is narrower than the first bandgap energy.

In a preferred embodiment of this invention the semiconductor material is a Group II–VI alloy semiconductor material, for example $Hg_{1-x}Cd_xTe$. The first temperature and second temperatures are established such that x has a value in the first layer that is larger than the value of x in the second layer. By example, the value of x is greater than approximately 0.5 in the first layer and is less than approximately 0.4 in the second layer.

The molten semiconductor material may include a selected dopant species and, as a result, the first layer and the second layer each contain the same selected dopant species.

Subsequent steps of the method include removing the two-layer structure from the growth chamber and forming an electrical contact upon a surface of the second (contact) layer.

In an illustrated embodiment of this invention, and not as a limitation upon the practice of this invention, the first temperature is in a range of approximately 400° C. to approximately 500° C., and the second temperature is in a range of approximately 250° C. to approximately 350° C.

In accordance with this invention the base layer is not removed from the growth chamber until after the growth of the contact layer, and is thus not exposed to the atmosphere or to any other sources of contaminates. Instead, the surface of the base layer is exposed only to the reducing atmosphere within the growth chamber. As a result the formation of oxides, barriers, and defects within a surface region of the base layer is substantially reduced or eliminated, as is the possibility of forming a non-ohmic (rectifying) contact between the metal contact structure and the base layer.

In addition, during the formation of the electrical contact (outside of the growth chamber) the surface of the base layer is isolated from atmospheric and other contaminates by the contact layer.

The uniformity of material between the base and contact layers is an important feature of this invention. This uniformity results from the fact that the base and contact layers are both grown from the same melt.

Furthermore, the initiation of the lower temperature growth of the contact layer upon the base layer causes some interdiffusion between the two layers and, as a result, a grading of the bandgap at the interface. Subsequent higher temperature growth or processing steps, or a subsequent higher temperature anneal, may also facilitate the formation of the interdiffusion region. This interdiffusion region is desirable in that it also tends to reduce the probability of the formation of a barrier to current flow between the base and contact layers.

BRIEF DESCRIPTION OF THE DRAWINGS

The above set forth and other features of this invention are made more apparent in the ensuing Detailed Description of the Invention when read in conjunction with the attached Drawings, wherein:

FIG. 3a is an energy band diagram for a p-type double-layer structure that illustrates the bandgaps of the base layer and contact layer as a result of the application of the fabrication process of this invention; and FIG. 3b is an energy band diagram for an n-type double-layer structure that illustrates the bandgaps of the base layer and contact layer as a result of the application of the fabrication process of this invention.

DETAILED DESCRIPTION OF THE INVENTION

A suitable and presently preferred LPE growth apparatus for practicing this invention is described in, by example, the following two articles: T. Tung, M. H. Kalisher, A. P. Stevens and P. E. Herning, "Liquid-Phase Epitaxy of $Hg_{1-x}Cd_xTe$ from Hg Solution: A Route to Infrared Detector Structures", Materials for Infrared Detectors and Sources, Mater. Res. Soc. Symp. Proc., Vol. 90 (Mater. Res. Soc., Pittsburgh, Pa., 1987), p. 321; and T. Tung, "Infinite-Melt Vertical Liquid-Phase Epitaxy of HgCdTe from Hg Solution: Status and Prospects", J. Crystal Growth 86 (1988), pg. 161–172.

The "infinite-melt" system is so named because of the relatively large amount (for example, kilograms) of Hg-rich melt solution that is employed, as contrasted to the before-mentioned Te-rich LPE process that typically employs only grams of melt solution per melt. As can be appreciated, when using the infinite-melt system a substantial cost savings is achieved by successively growing as many structures as possible from the same melt.

Figure 1:
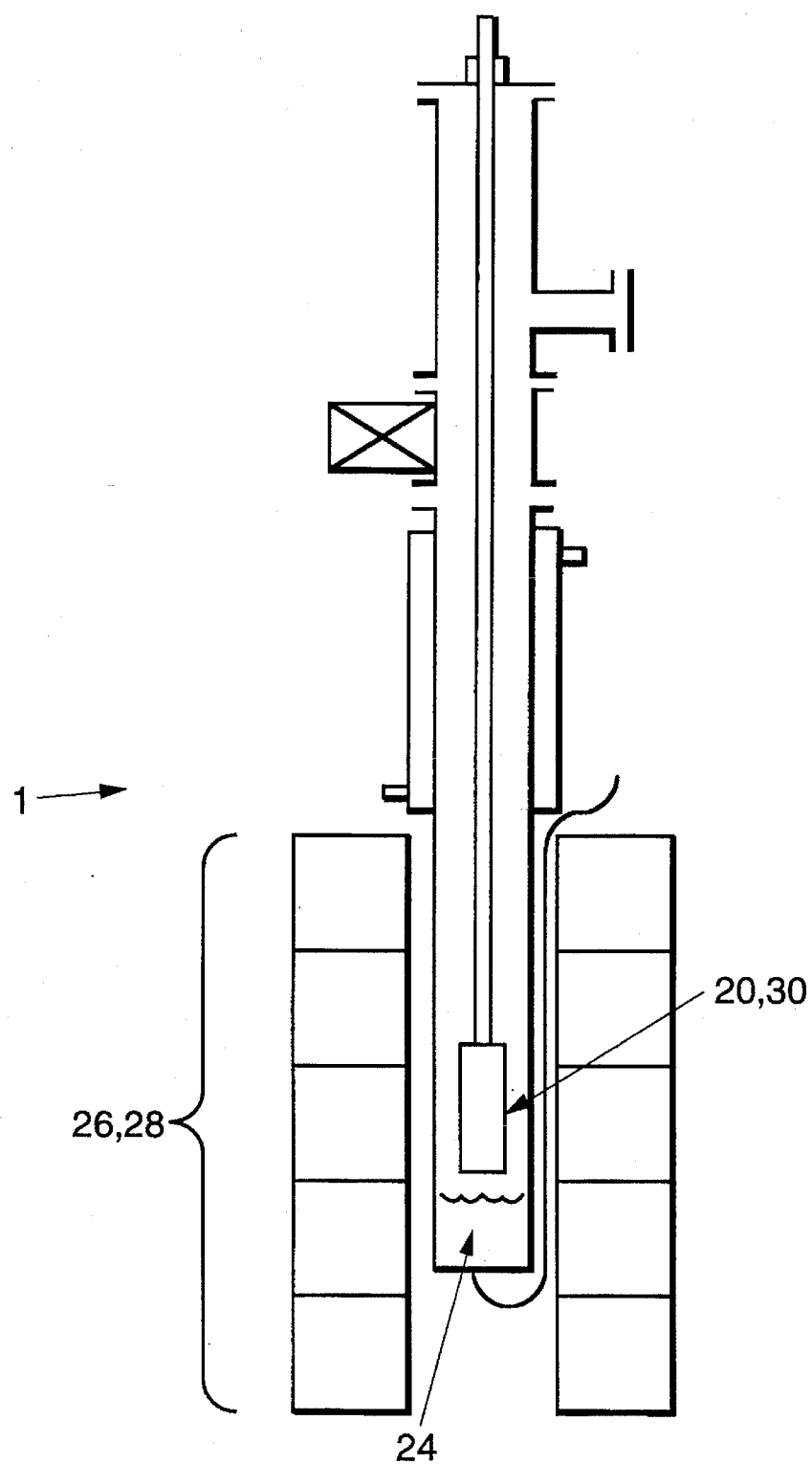
FIG. 1 is simplified diagram of an LPE growth apparatus that is suitable for practicing this invention.

FIG. 1 is a simplified, cross-sectional view of a vertical LPE (VLPE) infinite-melt growth system 1 of a type described in detail in the first above-referenced paper at page 325. The components of this growth system that are of the most concern to the description of this invention are the graphite growth paddle 20, protective shutter 30, furnace 26, controller 38, and the single melt 24.

However, it should be realized that the LPE growth system shown in FIG. 1 is but one suitable type of LPE growth system which can be used to practice this invention, and is therefore not to be viewed to limit the practice of this invention.

Figure 2A:
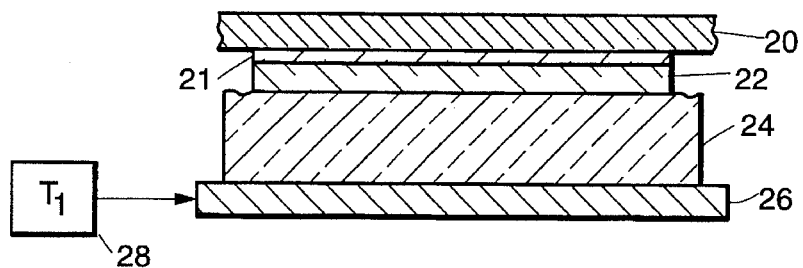
FIGS. 2a–2d are each a cross-sectional view, not to scale, of a semiconductor structure that illustrates the LPE fabrication process of this invention.

Reference is now made to FIGS. 2a–2d for illustrating a presently preferred method of this invention. In FIG. 2a the growth paddle, also referred to herein as a support 20, has a suitable substrate 21 placed thereon. The substrate 21 can be comprised of, by example, CdTe or CdZnTe. A base layer 22 is grown on the substrate 21 from a molten solution or melt 24 comprised of a desired semiconductor material. In the presently preferred embodiment of the invention the melt 24 is comprised of a Group II–VI semiconductor material such as $Hg_{1-x}Cd_xTe$, where the value of x has a value greater than approximately 0.4. The melt may contain a desired dopant species such as arsenic for forming a p-type base layer 22, or indium for forming an n-type base layer 22. The melt 24 is maintained at a first temperature ($T_1$) during the growth of the base layer 22 through the operation of a heater 26 and a heater control 28. By example, $T_1$ is a temperature in the range of approximately 400° C. to approximately 500° C.

Figure 2B:
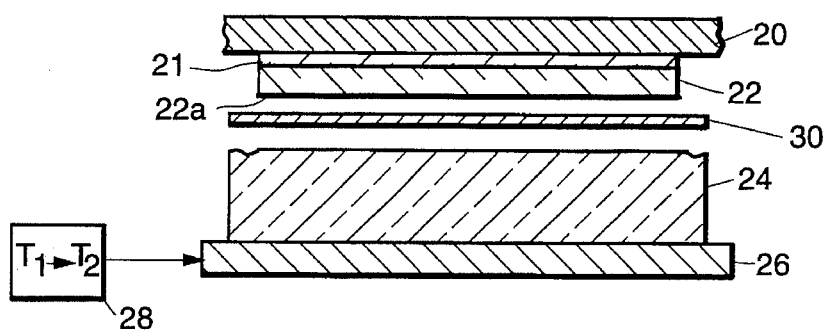

Referring now to FIG. 2b, when the base layer 22 is grown to a desired thickness the shutter 30 is employed to isolate the base layer 22 from the melt 24. Although this stops the further growth of the base layer 22, the presence of mercury vapor at the exposed surface 22a of the base layer 22 enables mercury vacancies within the surface region of the base layer to be filled, thereby improving the electrical characteristics of the surface region.

Significantly, the base layer 22 is not removed from the LPE growth apparatus, and is not required to be exposed to the atmosphere or to any other sources of contaminates. Instead, the surface 22a of the base layer is exposed only to the reducing atmosphere within the LPE growth apparatus. As a result, the formation of oxides, barriers, and defects within the surface region 22a is substantially reduced or eliminated.

While the shutter 30 is in place (stopping the growth process) the heater control 28 is employed to change the growth temperature from $T_1$ to a second, lower temperature $T_2$. By example, $T_2$ is a temperature within a range of approximately 250° C. to approximately 350° C.

Figure 2C:
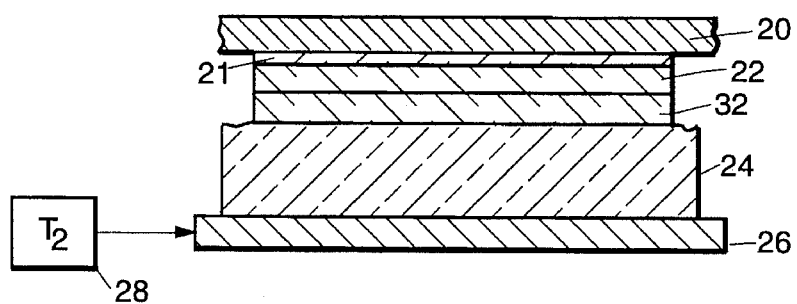

Referring to FIG. 2c, after the melt 24 is established at the temperature $T_2$ the shutter 30 is removed and the base layer 22 brought back into contact with the melt 24. This causes the growth of the contact layer 32 upon the surface of the base layer 22. Due to the lower growth temperature the contact layer 32 has a wider bandgap than the base layer 22, as illustrated in the graphs of FIGS. 3a and 3b. That is, the relative concentrations of mercury and cadmium (the value of x) within the contact layer 32 differs significantly from that of the base layer 22, the difference causing the contact layer 32 to exhibit a narrower bandgap (for example, approximately 0.5 eV) than the base layer 22. By example only, the value of x in the base layer 22 may be in the range of approximately 0.65 to 0.6, while the value of x in the contact layer 32 is may be in the range of approximately 0.3 to 0.2. This difference in the value of x is due to the lower growth temperature, and not to any requirement to vary the relative concentrations of mercury and cadmium in the melt 24.

It should be realized that as the value of x is decreased the composition of the Group II–VI alloy approaches that of HgTe, a compound that exhibits metal-like properties. These properties are generally better suited for matching to the work function of the selected contact metal system than are the properties of the semiconductor material HgCdTe.

Significantly, both the base layer 22 and the contact layer 32 are grown from the same melt, and thus also contain the same dopant species if one is present. Due to the lower growth temperature of the contact layer 32 the dopant is generally incorporated at a higher concentration than in the base layer 22.

Figure 2D:
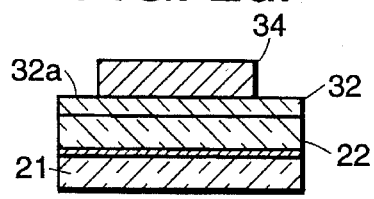

Reference is now made to FIG. 2d. When the contact layer 32 has been grown to a desired thickness, for example $2\pm1$ microns, the two-layer epitaxial structure 31 comprised of the base layer 22 and contact layer 32 is removed from the LPE growth apparatus. Further processing fabricates an electrical contact 34 by deposition or direct alloying upon the exposed surface 32a of the contact layer 32. During the formation of the contact 34 the surface 22a of the base layer 22 is beneficially isolated from the atmospheric and other contaminates by the contact layer 32.

It is noted that the initiation of the lower temperature growth of the contact layer 32 upon the base layer 22 causes some interdiffusion between the two layers and, as a result, a grading of the bandgap at the interface. This graded bandgap interface region is designated in FIGS. 3a and 3b with the letter "A". Subsequent higher temperature growth or other processing steps, and/or a subsequent higher temperature anneal, may also facilitate the formation of the interdiffusion region. This interdiffusion region is desirable in that its presence also tends to reduce the probability of the formation of a barrier to current flow between the base and contact layers.

In accordance with this invention the ohmic properties of the contact 34 to the underlying base layer 22 are improved over that achieved by conventional techniques. That is, the presence of the narrower band gap layer 32 provides for the creation of a superior ohmic electrical contact to the base layer 22 by minimizing the difference between the work functions of the semiconductor material and the contact metal.

The uniformity in material between the base and contact layers, that is, the absence of impurities such as atmospheric contaminants and oxides, is an important feature of this invention, in that it reduces the possibility of the creation of a barrier or potential that could hinder charge transport at the interface between the base layer 22 and the contact layer 32.

It should be realized that the structure shown in FIG. 2d is typically a portion of larger structure that contains one or more active devices, such as photoconductive or photovoltaic radiation detectors. However, in that the fabrication of these other components is not germane to an understanding of this invention, they are not shown or otherwise described in any detail.

It should be further realized that various modifications can be made to the teachings of this invention. For example, the teaching of this invention is not limited for use only with HgCdTe, or for use only with Group II–VI alloy materials. As an example, it is believed that at least some Group III–V systems, such as InSb, would benefit from the teaching of this invention. Furthermore, other temperatures, thicknesses, dopant species and the like can be employed.

It is also within the scope of this invention to leave the base layer 22 in contact with the melt 24 while the temperature of the melt is reduced from $T_1$ to $T_2$. This will generally result in an increased thickness of the contact layer 32, and also in a substantial amount of compositional grading through the thickness of the contact layer 32, instead of the relatively more abrupt change in the composition that results when the growth of the contact layer is terminated while the temperature is ramped down. The increased thickness of the contact layer and the substantial amount of compositional grading thereof may be desirable features for some applications.

Thus, while the invention has been particularly shown and described with respect to a preferred embodiment thereof, it will be understood by those skilled in the art that changes in form and details may be made therein without departing from the scope and spirit of the invention.

What is claimed is:

1. A method for fabricating a structure comprised of a semiconductor material, comprising the steps of:

providing a growth chamber that contains a molten semiconductor material, the molten semiconductor material having a first temperature;

growing, at the first temperature, a first layer of the structure from the molten semiconductor material, the first layer being grown to have a first bandgap energy;

reducing the first temperature of the molten semiconductor material to a second temperature without removing the first layer from the growth chamber and without intentionally adding any material to the molten semiconductor material; and growing from the same molten semiconductor material as was used to grow the first layer, at the second temperature, a second layer upon a surface of the first layer, the second layer being grown to have a second bandgap energy that is narrower than the first bandgap energy.

2. A method as set forth in claim 1 wherein the semiconductor material is comprised of a Group II–VI alloy semiconductor material.

3. A method as set forth in claim 2 wherein the Group II–VI semiconductor material is comprised of $Hg_{1-x}Cd_xTe$, wherein the first temperature is established such that x has a value that is greater than approximately 0.6 in the first layer, and wherein the second temperature is established such that x has a value that is less than approximately 0.4 in the second layer.

4. A method as set forth in claim 1 wherein the molten semiconductor material includes a selected dopant species, and wherein the first layer and the second layer each contain the selected dopant species.

5. A method as set forth in claim 1 and further comprising the steps of:

removing the structure from the growth chamber; and forming an electrical contact upon a surface of the second layer.

6. A method as set forth in claim 1 wherein the first temperature is in a range of approximately 400° C. to approximately 500° C., and wherein the second temperature is in a range of approximately 250° C. to approximately 350° C.

7. A method for fabricating a two-layer epitaxial structure by a liquid phase epitaxy (LPE) process, the structure being comprised of a Group II–VI semiconductor material, comprising the steps of:

providing an LPE growth chamber that contains a molten Group II–VI semiconductor material, the molten Group II–VI semiconductor material having a first temperature;

growing, at the first temperature, a base layer from the molten Group II–VI semiconductor material, the base layer being grown to have a first bandgap energy;

isolating the base layer from the molten Group II–VI semiconductor material without removing the base layer from the growth chamber;

reducing the first temperature of the molten Group II–VI semiconductor material to a second temperature; and growing at the second temperature, from the same molten Group II–VI semiconductor material as was used to grow the base layer, a contact layer upon a surface of the base layer to form a two-layer epitaxial structure, the contact layer being grown to have a second bandgap energy that is narrower than the first bandgap energy.

8. A method as set forth in claim 7 wherein the Group II–VI semiconductor material is comprised of $Hg_{1-x}Cd_xTe$, wherein the first temperature is established such that x has a value that is greater than approximately 0.6 in the base layer, and wherein the second temperature is established such that x has a value that is less than approximately 0.4 in the contact layer.

9. A method as set forth in claim 7 wherein the molten Group II–VI semiconductor material includes a selected dopant species, and wherein the base layer and the contact layer are each grown to contain the selected dopant species.

10. A method as set forth in claim 7 and further comprising the steps of:

removing the two-layer epitaxial structure from the growth chamber; and forming an electrical contact upon a surface of the contact layer.

11. A method as set forth in claim 7 wherein the first temperature is in a range of approximately 400° C. to approximately 500° C., and wherein the second temperature is in a range of approximately 250° C. to approximately 350° C.

12. A method as set forth in claim 7 wherein the step of isolating includes a step of activating a shutter means to isolate the surface of the base layer from the molten Group II–VI semiconductor material.

13. A method as set forth in claim 7 wherein the step of reducing the temperature includes a step of exposing the surface of the base layer to Hg vapor within the growth chamber.

14. A method for fabricating a two-layer epitaxial structure by a liquid phase epitaxy (LPE) process, the structure being comprised of a Group II–VI semiconductor material, comprising the steps of:

providing an LPE growth chamber that contains a molten Group II–VI semiconductor material that is comprised of $Hg_{1-x}Cd_xTe$,, the molten Group II–VI semiconductor material having a first temperature within a range of approximately 400° C. to approximately 500° C.;

growing, at the first temperature, a base layer from the molten Group II–VI semiconductor material, the base layer being grown to have a first bandgap energy;

isolating the base layer from the molten Group II–VI semiconductor material by activating a shutter means to isolate the surface of the base layer from the molten Group II–VI semiconductor material, without removing the base layer from the growth chamber;

reducing the first temperature of the molten Group II–VI semiconductor material to a second temperature within a range of approximately 250° C. to approximately 350° C. while exposing the surface of the base layer to Hg vapor within the growth chamber and while maintaining a temperature of the base layer to be approximately equal to the temperature of the molten Group II–VI semiconductor material; and growing at the second temperature, from the same molten Group II–VI semiconductor material as was used to grow the base layer, a contact layer upon a surface of the base layer to form a two-layer epitaxial structure, the contact layer being grown to have a second bandgap energy that is narrower than the first bandgap energy.

15. A method as set forth in claim 14 wherein the molten Group II–VI semiconductor material includes a selected dopant species, and wherein the base layer and the contact layer are each grown to contain the selected dopant species.

16. A method as set forth in claim 14 and further comprising the steps of:

removing the two-layer epitaxial structure from the growth chamber; and forming an electrical contact upon a surface of the contact layer.

* * * * *